(12) United States Patent
Basker et al.

(10) Patent No.: US 10,297,614 B2
(45) Date of Patent: May 21, 2019

(54) GATE TOP SPACER FOR FINFET

(71) Applicant: International Business Machines Corporation, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/232,482

(22) Filed: Aug. 9, 2016

(65) Prior Publication Data

US 2018/0047754 A1 Feb. 15, 2018

(51) Int. Cl.
| H01L 29/78 | (2006.01) |
| H01L 27/12 | (2006.01) |
| H01L 21/8234 | (2006.01) |
| H01L 29/66 | (2006.01) |

(52) U.S. Cl.
CPC .. *H01L 27/1211* (2013.01); *H01L 21/823431* (2013.01); *H01L 21/823437* (2013.01); *H01L 21/823468* (2013.01); *H01L 21/823475* (2013.01); *H01L 29/6656* (2013.01); *H01L 29/66545* (2013.01); *H01L 29/66795* (2013.01); *H01L 29/785* (2013.01); *H01L 29/7856* (2013.01)

(58) Field of Classification Search
CPC ............. H01L 29/785; H01L 29/66795; H01L 29/7856; H01L 29/6656; H01L 29/66553; H01L 27/1211; H01L 21/823431; H01L 21/823456; H01L 21/82385; H01L 21/823437
See application file for complete search history.

(56) References Cited

U.S. PATENT DOCUMENTS

| 6,777,760 B1 | 8/2004 | Jan et al. |
| 7,141,856 B2 | 11/2006 | Lee et al. |
| 8,022,478 B2 | 9/2011 | Anderson et al. |
| 8,232,148 B2 * | 7/2012 | Li ..................... H01L 21/28088 257/351 |
| 8,288,296 B2 | 10/2012 | Wong et al. |
| 8,716,786 B2 | 5/2014 | Baumgartner et al. |
| 9,099,555 B2 * | 8/2015 | Le Royer ............ H01L 29/7831 |

(Continued)

OTHER PUBLICATIONS

V.D. Kunz et al., "Reduction of parasitic capacitance in vertical MOSFETs by spacer local oxidation," IEEE Transactions on Electron Devices, vol. 50, No. 6, 2003, pp. 1487-1493.

(Continued)

*Primary Examiner* — Michael M Trinh
(74) *Attorney, Agent, or Firm* — Daniel P. Morris, Esq.; Hoffmann & Baron, LLP

(57) ABSTRACT

The capacitance between gate structures and source/drain contacts of FinFET devices is reduced by the incorporation of inner spacers in the top portions of the gate structures. A replacement metal gate process used in the fabrication of such devices includes formation of the inner spacers following partial removal of dummy gate material. The remaining dummy gate material is then removed and replaced with gate dielectric and metal gate material.

19 Claims, 9 Drawing Sheets

(56) References Cited

U.S. PATENT DOCUMENTS

| | | | |
|---|---|---|---|
| 2004/0238897 A1 | 12/2004 | Oishi | |
| 2013/0049142 A1* | 2/2013 | Liu | H01L 29/4983 |
| | | | 257/412 |
| 2013/0093026 A1 | 4/2013 | Wan et al. | |
| 2015/0129934 A1* | 5/2015 | Xie | H01L 27/0886 |
| | | | 257/192 |
| 2015/0263128 A1* | 9/2015 | Basker | H01L 29/6681 |
| | | | 257/288 |
| 2015/0380514 A1* | 12/2015 | Bentley | H01L 29/6656 |
| | | | 257/346 |
| 2016/0049488 A1* | 2/2016 | Shen | H01L 29/42376 |
| | | | 257/368 |
| 2016/0240650 A1* | 8/2016 | Chang | H01L 29/785 |
| 2017/0179117 A1* | 6/2017 | Chang | H01L 27/0886 |
| 2017/0316984 A1* | 11/2017 | Lin | H01L 21/82348 |
| 2017/0352744 A1* | 12/2017 | Basker | H01L 29/66795 |

OTHER PUBLICATIONS

I. Saad et al., "Reduced parasitic capacitances analysis of nanoscale vertical MOSFET," IEEE International Conference on Semiconductor Electronics (ICSE)m 2010, pp. 25-29.

* cited by examiner

GATE TOP SPACER FOR FINFET

BACKGROUND

The present disclosure relates generally to the electrical, electronic and computer arts and, more particularly, to FinFET structures and their fabrication.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning. Gate-last procedures can involve forming a dummy gate, fabricating other elements of the transistor such as the source/drain regions, removing the dummy gate, and replacing the removed dummy gate with actual gate materials.

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Gate spacers can be formed on sidewalls of each of the disposable gate structures, for example, by deposition of a conformal dielectric material layer and an anisotropic etch. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are ordinarily formed in the gate cavities. Replacement gate structures are formed by replacement of the disposable structures and overlie channel regions of field effect transistors. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k)

material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

The replacement gate structures can include gate electrodes having different compositions in different regions of the substrate. For example, a first work function material layer can be deposited on the gate dielectric layers in one region and a second work function material can be deposited on the gate dielectric layers in a second region. An electrically conductive material layer can be deposited on the work function material layers. The conductive material layer can include a conductive material deposited by physical vapor deposition, chemical vapor deposition, and/or electroplating. The conductive material layer can be an aluminum layer, a tungsten layer, an aluminum alloy layer, or a tungsten alloy layer. Tungsten can be deposited by chemical vapor deposition. Portions of the gate conductor layer, the work function material layers, and the gate dielectric layers are removed from the planarization dielectric layer by a planarization process. Replacement gate structures are thus formed, which include gate conductor layers, work function material layers, and gate dielectric layers.

BRIEF SUMMARY

Techniques are provided for forming FinFET structures having inner and outer spacers adjoining gate structures during CMOS fabrication.

In one aspect, an exemplary fabrication method includes obtaining a monolithic structure including a plurality of parallel semiconductor fins, a dummy gate on the semiconductor fins, and sidewall spacers on the dummy gate. The dummy gate is partially removed to form a recess between the sidewall spacers and above a remaining portion of the dummy gate. Inner spacers are formed within the recess and on the sidewall spacers. The remaining portion of the dummy gate is removed, thereby exposing a channel portion of the semiconductor fin and forming spaces beneath the inner spacers. A gate dielectric layer is formed within the recess and the spaces and on the channel portion of the semiconductor fin. A barrier layer is formed on the gate dielectric layer and the recess and spaces are filled with electrically conductive gate material.

In another aspect, an exemplary monolithic structure includes a substrate including a plurality of parallel, monocrystalline semiconductor fins, the fins including one or more channel regions, and source/drain regions integral with and adjoining the channel regions. A gate structure adjoins each channel region. Each gate structure includes a pair of sidewall spacers, a pair of inner spacers adjoining the sidewall spacers, and an electrically conductive gate including a top portion between the inner spacers and a bottom portion extending beneath the inner spacers.

In a further aspect, a gate structure for a FinFET device includes a pair of sidewall spacers, a pair of inner spacers adjoining the sidewall spacers, the inner spacers including bottom surfaces, and an electrically conductive gate including a top gate portion between the inner spacers and a bottom gate portion extending laterally beneath the bottom surfaces of the inner spacers. The top gate portion of the electrically conductive gate has a smaller width dimension than the bottom gate portion thereof.

Techniques as disclosed herein can provide substantial beneficial technical effects. By way of example only and without limitation, one or more embodiments may provide one or more of the following advantages:

Reduction of gate to source/drain contact capacitance;
Replacement metal gate (RMG) technique compatible with existing CMOS fabrication processes.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a FinFET structure wherein an inner spacer is formed within the top portion of a gate structure to reduce gate to contact capacitance. Such capacitance may be problematic due to the shrinking dimensions of various integrated circuit components. An exemplary fabrication method for forming the structure is further described.

Figure 1A:
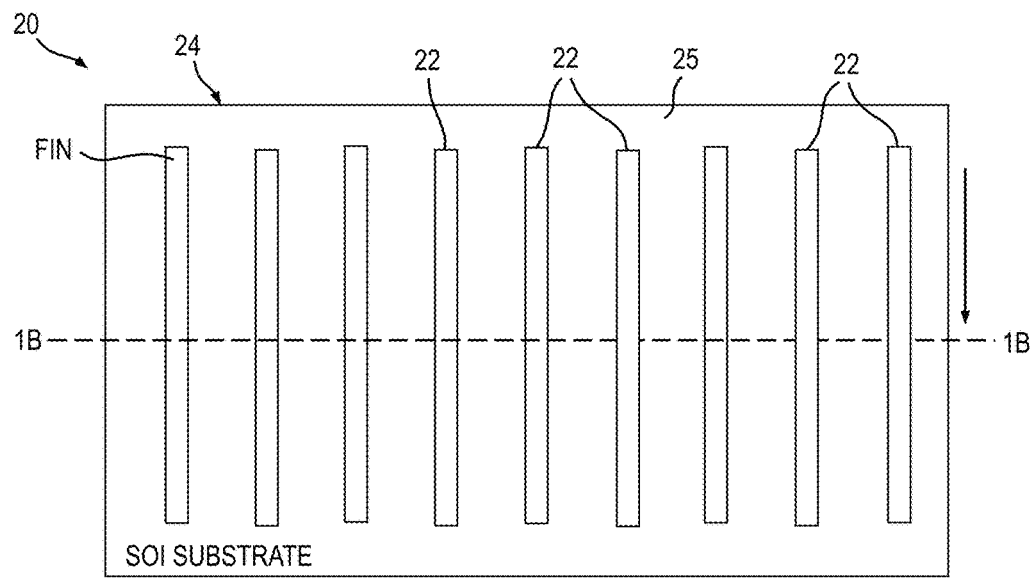
FIG. 1A is a schematic top plan view of an array of fins formed using a semiconductor-on-insulator substrate.
Figure 1B:
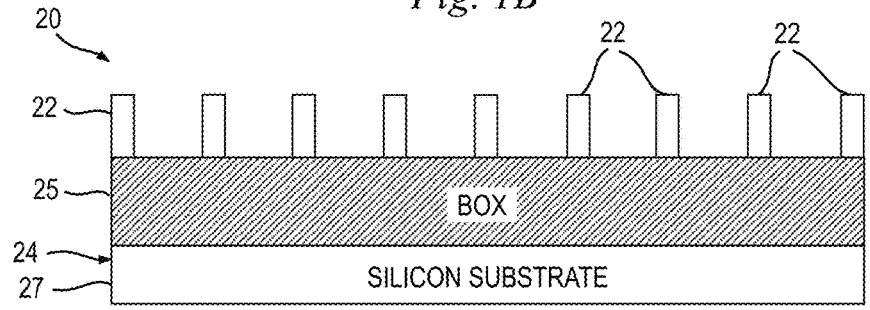
FIG. 1B is a sectional view thereof taken along line 1B.
Figure 1C:
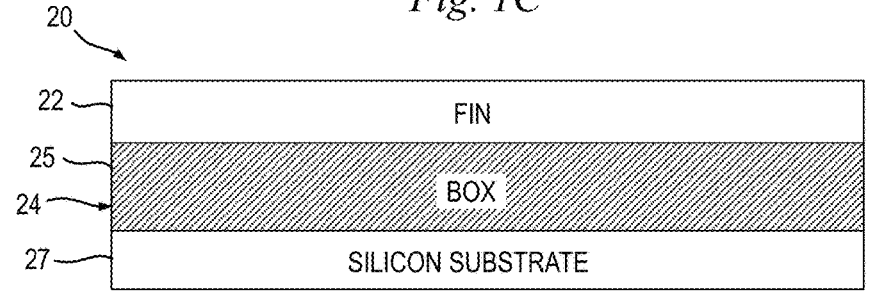
FIG. 1C is a further schematic, cross-sectional view thereof.

FIGS. 1A-1C depict a finned structure 20 formed from a semiconductor-on-insulator substrate 24. The substrate includes a crystalline semiconductor layer, which can be referred to as an SOI layer, from which an array of semiconductor fins 22 is formed. The fin heights are commensurate with the thickness of the SOI layer of the original substrate from which they are formed. Fin pitch is 25-50 nm in some embodiments. The substrate layer is essentially undoped in one or more embodiments. The SOI layer and resulting fins 22 are substantially monocrystalline in some embodiments. The SOI layer from which the fins 22 are formed and the bottom substrate layer 27 may be, but are not necessarily, comprised of the same materials. An electrically insulating layer 25 such as a buried oxide (BOX) layer is provided between the substrate layer 27 and the SOI layer. Silicon dioxide is among the materials that may be employed to form the electrically insulating layer 25. Other buried insulators such as boron nitride (BN) and aluminum oxide ($Al_2O_3$) may alternatively be employed to form the BOX layer in some embodiments. Depending on the heights of the fins 22 to be formed, in some embodiments the thickness of the crystalline semiconductor layer (SOI layer) is in the range of 10 nm to 60 nm. Various methods of fabricating semiconductor-on-insulator (SOI) substrates as employed in one or more embodiments are known, one of which is Separation-by-Implanted Oxygen (SIMOX), wherein oxygen ions are implanted into a single crystal silicon substrate to form a BOX film. Another method of forming an SOI substrate is through the SMART CUT® method and wafer bonding, wherein two semiconductor substrates with silicon oxide surface layers are bonded together at the silicon oxide surfaces to form a BOX layer between the two semiconductor substrates. Methods of forming semiconductor fins 22 using photolithography or sidewall image transfer (SIT) are familiar to those of skill in the art. SIT facilitates the fabrication of fins that are smaller in spacing than photolithographic techniques permit. The SIT process forms features (such as fins) with a pitch equal to half of the smallest pitch obtainable with lithography. For example, with the state-of-the-art UV sources at 193 nm wavelength the smallest pitch that can be formed with conventional lithography is about 80 nm; the SIT process can generate fins with a pitch of about 40 nm. Fins 22 having widths of eight nanometers (8 nm) or less are provided in some embodiments. It will be appreciated that the fins 22 may or may not have sidewalls that are entirely vertical. The bottoms of the fins may in fact be larger in width than the top portions thereof. For example, if a substrate in an exemplary embodiment is a (100) substrate, the side wall surfaces of the semiconductor fins described as (110) surfaces are at least close to being (110) surfaces but may or may not be exactly (110) surfaces. It will further be appreciated that the fabrication methods discussed herein can be applied with respect to structures formed on bulk semiconductor (e.g. silicon) substrates as well as SOI substrates to provide fuses in selected regions.

Figure 2A:
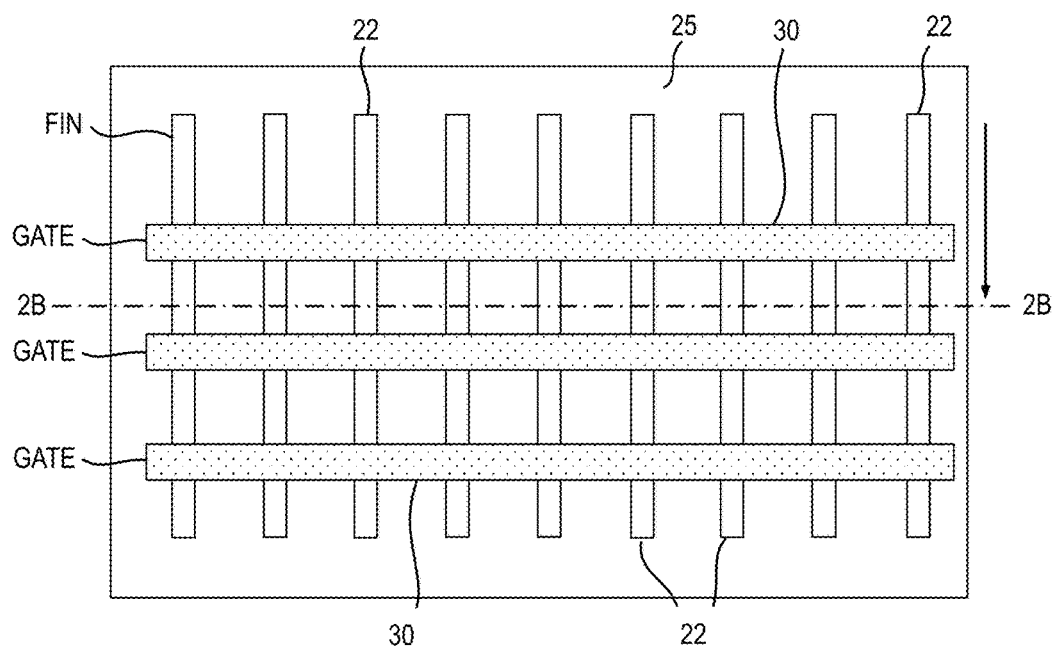
FIG. 2A is a schematic top plan view showing dummy gates formed on the array of fins.
Figure 2B:
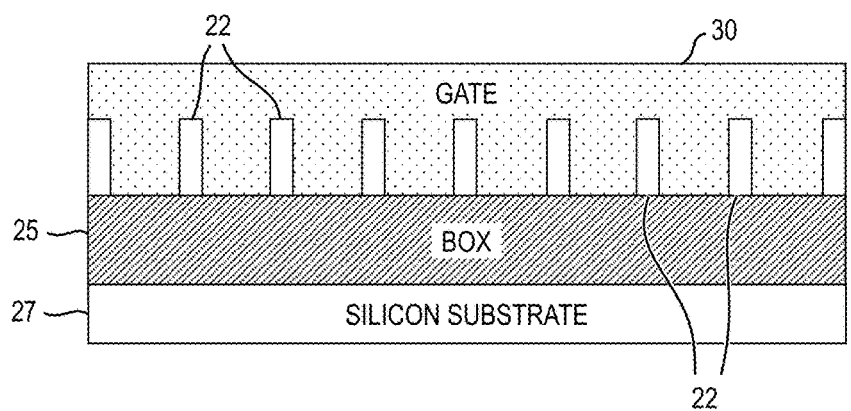
FIG. 2B is a sectional view thereof taken along line 2B.
Figure 2C:
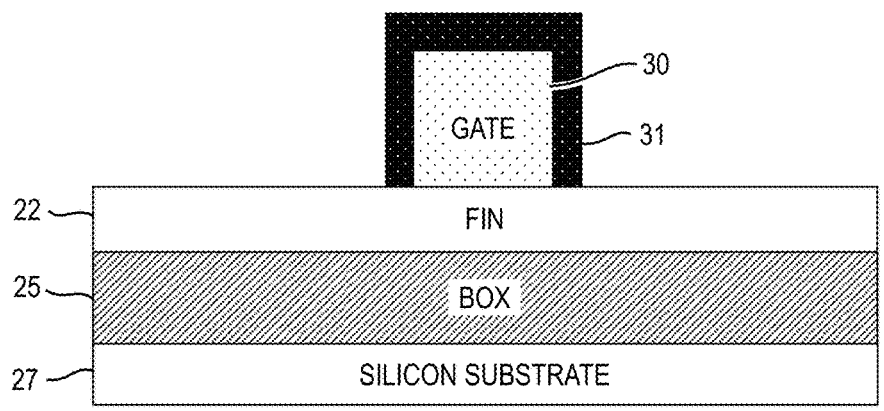
FIG. 2C is a schematic, cross-sectional view showing a dummy gate and gate spacer formed on one of the fins.

With reference now to FIGS. 2A and 2B, dielectric and polysilicon layers may be deposited on the finned substrate and patterned to form dummy gates 30 in accordance with standard polysilicon gate CMOS process flows. The dummy gates 30 extend across a plurality of the parallel semiconductor fins 22 and have substantially the same dimensions in one or more embodiments. Any gate pitch suitable for the intended application of the completed product may be chosen. Gate sidewall structures or spacers 31 are formed on the dummy gates 30, as shown in FIG. 2C. A silicon nitride ($Si_3N_4$) layer can be deposited via CVD, PECVD, sputtering, or other suitable technique, forming the sidewall spacers 31. The spacers 31 can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The dummy gates 30 and associated spacers 31 protect the underlying portions of the semiconductor fins 22 that later function as channel regions of FinFET devices. Fin regions outside the dummy gates 30 and sidewall spacers 31 are later used to form source/drain regions. Optionally, the fins 22 may be subjected to ion implantation following formation of the gate sidewall spacers 31 to form extension junctions. The sidewall spacers 31 may alternatively be formed from other materials, for example siliconborocarbonitride (SiBCN) or siliconoxycarbonitride (SiOCN), siliconoxycarbide (SiOC).

Figure 3:
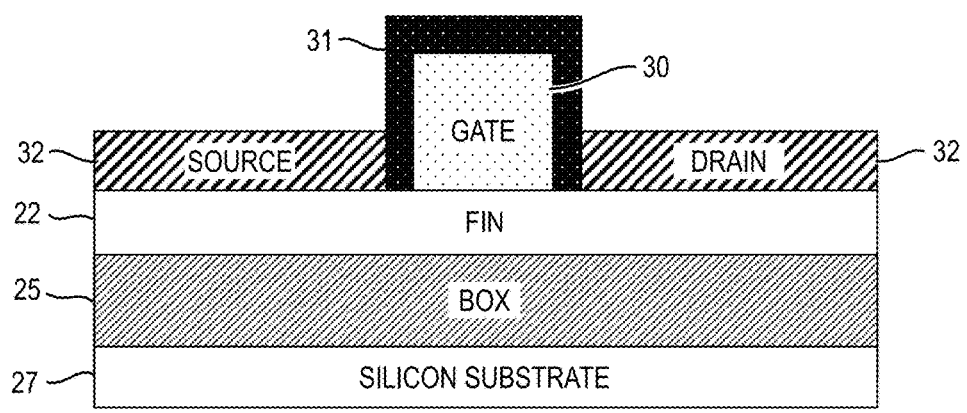
FIG. 3 is a schematic, cross-sectional view showing source/drain regions formed on the finned structure.

Expanded source/drain regions 32 can be grown epitaxially on the exposed portions of the semiconductor fins 22 adjoining the dummy gate and spacers to obtain the structure shown in FIG. 3. Doped silicon or silicon germanium grown epitaxially on the sidewalls (110 surfaces) of silicon fins increases the volumes of the source/drain regions in some embodiments. Either p-type devices or n-type devices can be fabricated depending on the conductivity types of the epitaxial source/drain regions, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. In embodiments where n-type FinFET devices are to be formed, in-situ n-doped silicon may be used to form the epitaxial source/ drain regions 32. In-situ doping of the source/drain regions can be conducted using conventional precursor materials and techniques. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $2\times10^{20}$-$2\times10^{21}$ cm$^{-3}$ and the resulting FinFET structure is p-type. In other embodiments, the source/drain semiconductor material is monocrystalline silicon, the dopant is phosphorus in a concentration in the range of $2\times10^{20}$ to $2\times10^{21}$ cm$^{-3}$ and the resulting FinFET structure is n-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 500° C. to 900° C. Fin sidewall surfaces are (110) surfaces in one or more embodiments such that epitaxial growth thereon produces in diamond-shaped structures due to the fact that the growth rate on (111) planes is considerably less than on (110) planes. Self-limiting diamond-shaped structures can accordingly be formed. Growth may be limited in some exemplary embodiments to avoid merging of the faceted source/drain regions. It will be appreciated that doped source/drain regions can be formed using other known methods including but not limited to implantation and diffusion doping techniques.

Figure 4:
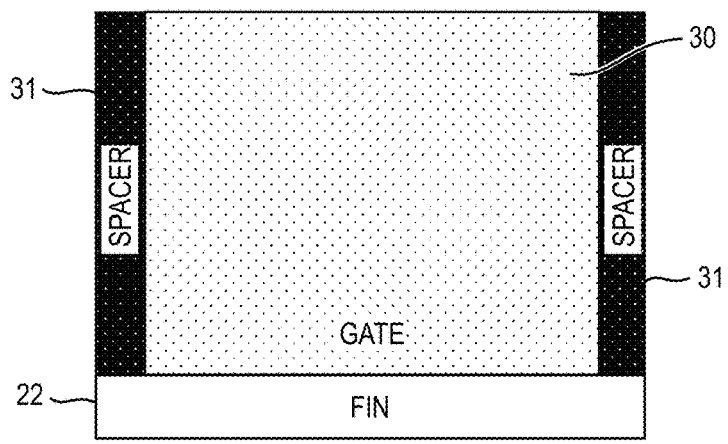
FIG. 4 is a schematic, cross-sectional view showing the gate region of the structure following removal of spacer material from the top surface of the dummy gate.
Figure 5:
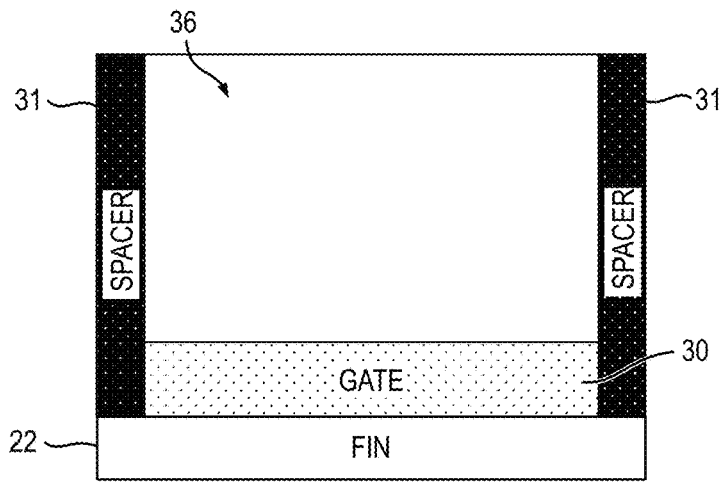
FIG. 5 is a schematic, cross-sectional view showing the structure following partial removal of the dummy gate.
Figure 15:
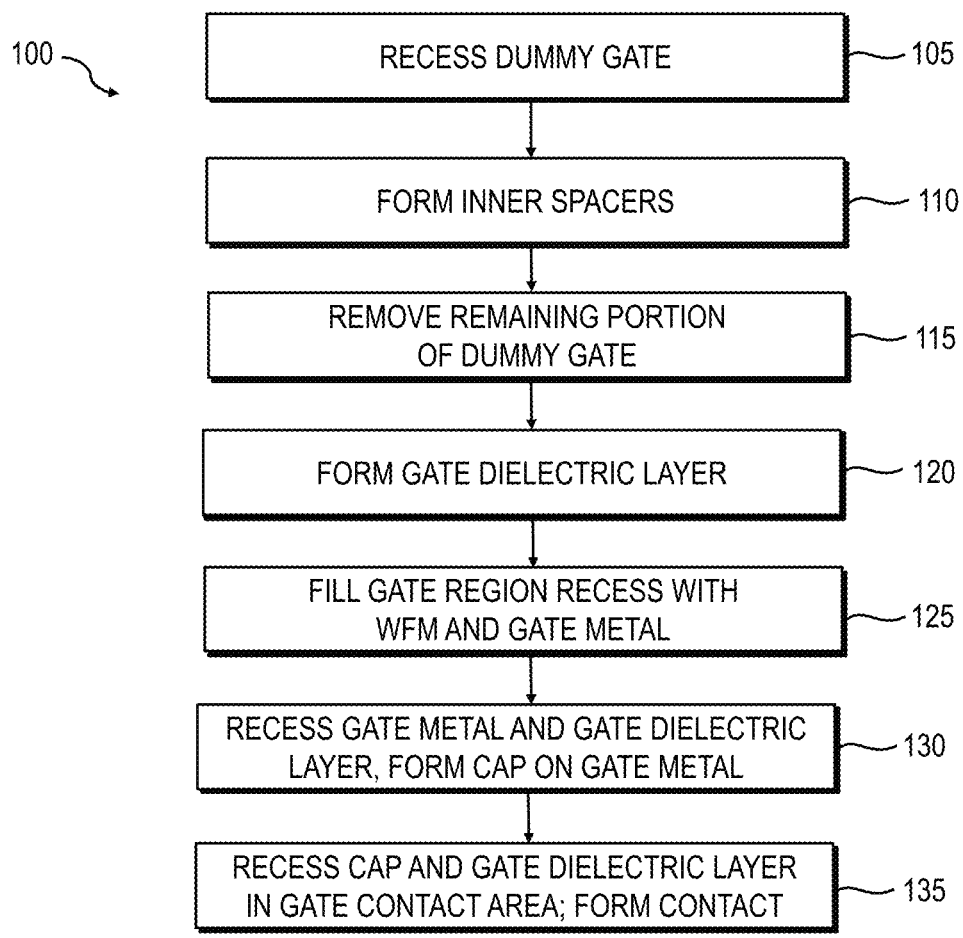
FIG. 15 is a flow diagram for forming a gate structure in accordance with an exemplary embodiment.

FIG. 15 shows a flow diagram of a method 100 for forming a gate structure in a FinFET device in accordance with an illustrative embodiment. FIGS. 5-13, in turn, show sectional views of intermediate film stacks as the method 100 is completed. Once the source/drain regions 32 have been formed, the structure is filled with an interlayer dielectric (ILD) and subjected to chemical mechanical planarization (CMP). The CMP process, for example poly-open planarization (POP), may be used to expose the polysilicon gate top to obtain the gate structure shown in FIG. 4. The dummy gates 30 are partially removed in step 105 by a process such as reactive ion etching (ME) and/or wet chemical etching to form recesses 36 bounded by the sidewall spacers 31, as shown in FIG. 5. In some embodiments, ten to twenty nanometers (10-20 nm) of the originally formed dummy gates remains above the top of the fin. In regions of the resulting structure where the exposed portions of the fins 22 are to be used as channel regions of subsequently formed FinFET devices, the recesses 36 are later filled with a gate dielectric layer, a work function setting material, and metal gate as part of a "gate-last" fabrication (RMG) process, as described further below.

Figure 6:
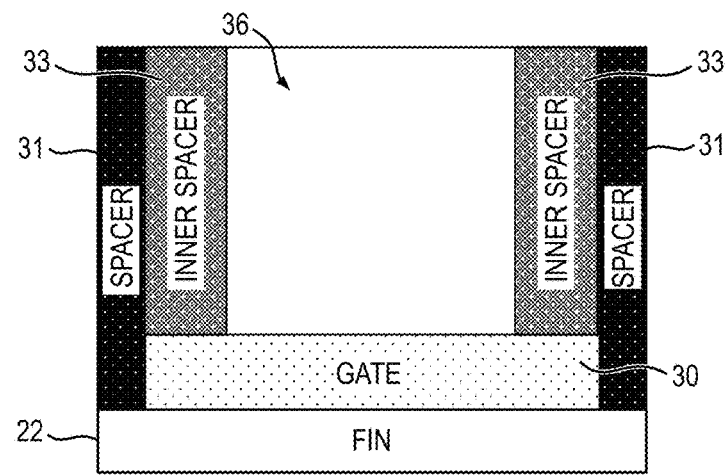
FIG. 6 is a schematic, cross-sectional view showing the structure following formation of an inner spacer within a recess between outer spacers.

As shown in FIG. 6, inner spacers 33 are formed on the remaining portion of the dummy gate 30 within the recess 36. The inner spacers can be formed by any method known in the art, including depositing a conformal nitride layer over the dummy gate structures and removing unwanted material using an anisotropic etching process such as reactive ion etching or plasma etching. The inner spacers 33 may alternatively be formed in step 110 of low-k dielectric materials such as silicon borocarbonitride (SiBCN), silicon oxycarbonitride (SiOCN), silicon oxycarbide (SiOC), or combinations thereof. The use of low-k dielectric material having a dielectric constant below 3.9 and more preferably below 3.0 facilitates reducing the gate to contact capacitance, as discussed further below. Techniques for depositing such low-k materials and forming spacers therefrom are known to the art. The inner spacers 33 accordingly adjoin the inner surfaces of the sidewall spacers 31 formed on the dummy gate 30 and portions of the top surface of the remaining portion of the dummy gate. The top surface of the remaining portion of the dummy gate between the inner spacers 33 is exposed.

The remaining portion of the dummy gate 30 is selectively removed in step 115 following formation of the inner spacers 33. Wet etching in hot ammonia (selective to dielectrics) can be employed to yield the structure shown in FIG. 7. Such processing leaves the recess 36 over the exposed channel portion of the fin 22. As the portions of the dummy gate beneath the inner spacers 33 are also removed, spaces 36A adjoining the recess and bordered by the inner surfaces of the sidewall spacers 31, the fin 22 and the bottom surfaces of the inner spacers 33 are formed.

Figure 8:
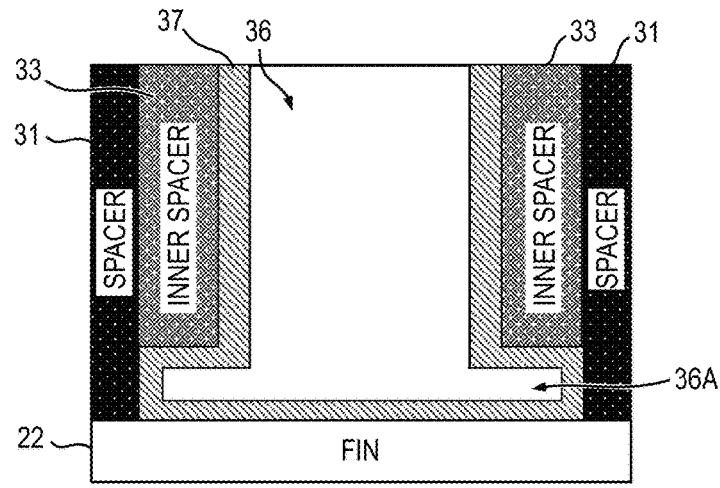
FIG. 8 is a schematic, cross-sectional view showing the structure of FIG. 7 following the formation of a gate dielectric layer in the gate region.

As shown in FIG. 8, a gate dielectric layer 37 is formed on the channel fin and the gate region surfaces adjoining the channel 36 and spaces 36A. In some embodiments, a high-k gate dielectric layer is conformally deposited in the recess 36 following completion of dummy gate removal. The thickness of the gate dielectric material can vary depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The gate dielectric layer used in some devices may alternatively include a multi-layer of $SiO_2$, SiON, SiN, and a high-k dielectric material, including but not limited to hafnium oxide ($HfO_2$), aluminum oxide ($Al_2O_3$), lanthanum oxide ($La_2O_3$), zirconium oxide ($ZrO_2$), and their respective silicates. The thickness of the gate dielectric may be in the range of 1.0 nm-5.0 nm in some exemplary embodiments. Post-deposition annealing (PDA) is conducted in accordance with conventional processing procedures.

A titanium nitride (TiN) liner/barrier film layer is conformally deposited on the gate dielectric layer using, for example, an ALD process. The barrier film layer may have a thickness of about 40 Å of titanium nitride (TiN) in embodiments wherein tungsten metallization is later employed. Tantalum nitride (Ta(N)) may alternatively be employed to form the barrier film layer. The barrier film layer may comprise multiple layers in some embodiments, including a work function material adjoining the gate dielectric layer.

Figure 9:
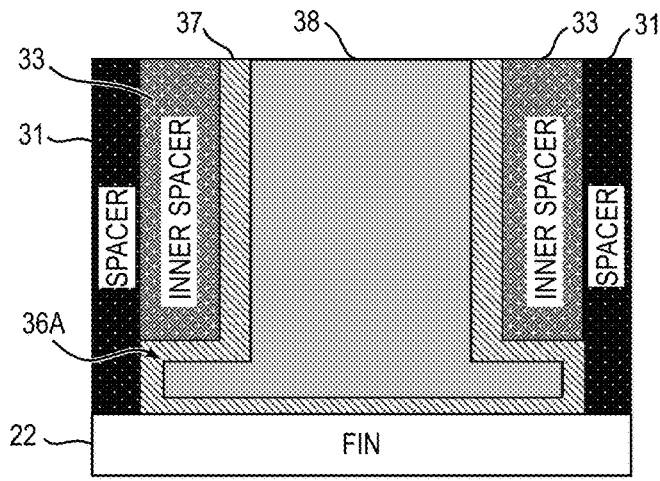
FIG. 9 is a schematic, cross-sectional view showing the structure of FIG. 8 following deposition of work function material and gate metal in the gate region.
Figure 10:
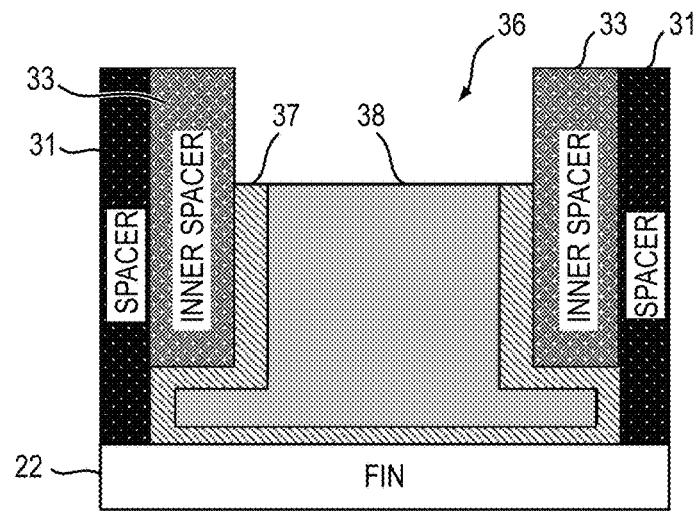
FIG. 10 is a schematic, cross-sectional view showing the structure of FIG. 9 following recessing of the gate metal and gate dielectric layer.

The recess 36 and laterally extending spaces 36A are filled with gate metal to provide a structure as schematically illustrated in FIG. 9. The gate metal and underlying barrier layer are designated by reference numeral 38 in the drawings. Optionally, hydrogen-based processes may be employed to prepare/engineer an exposed metal surface such that subsequent metal deposition takes place selectively on exposed metal surfaces as opposed to non-metal surfaces such as the surfaces of dielectric materials. Nucleation selectively takes place on an exposed electrically conductive surface during the deposition of gate metal in some embodiments. Hydrogen-based surface treatment of the structure includes exposing the structure to hydrogen under certain pressure (0.5-10 torr), temperature (200-400° C.) and flow rate (1-12 standard liters per minute (slm)). The surface material (e.g. Ti(N), Ta(N)) lining the recesses 36 and spaces 36A thereby becomes amenable to the deposition of electrically conductive metals that can function as gate electrodes.

Metal gate material is selectively or non-selectively deposited during step 125 on the treated or untreated surface of the barrier layer. The gate metal layer can be up to five hundred nanometers (500 nm) in thickness in exemplary embodiments, though lesser and greater thicknesses may also be employed. Chemical vapor deposition (CVD) may be employed for the selective deposition of metals such as tungsten, cobalt, ruthenium, rhodium, osmium, iridium and/or molybdenum. If tungsten metallization is employed, about 40 Å of titanium nitride (TiN) is typically employed as a barrier layer. The gate electrode may be deposited as multiple layers in some embodiments. Excess metal (metal overburden), if present on the structure, is removed via chemical mechanical planarization (CMP). Tungsten is amenable to reactive ion etching and is suitable in embodiments where such etching is to be conducted. The width of the gate metal near the bottom of the gate structure, where the gate metal adjoins the channel region of the fin 22, is greater than the width thereof in the top region of the gate structure. In one or more embodiments including that shown in FIG. 9, the height of the relatively narrow top portion of the metal gate/barrier layer 38 formed between the inner spacers 33 is greater than the height of the relatively wide bottom portion thereof that is formed between the sidewall spacers 31 and extends beneath the inner spacers 33.

Figure 11:
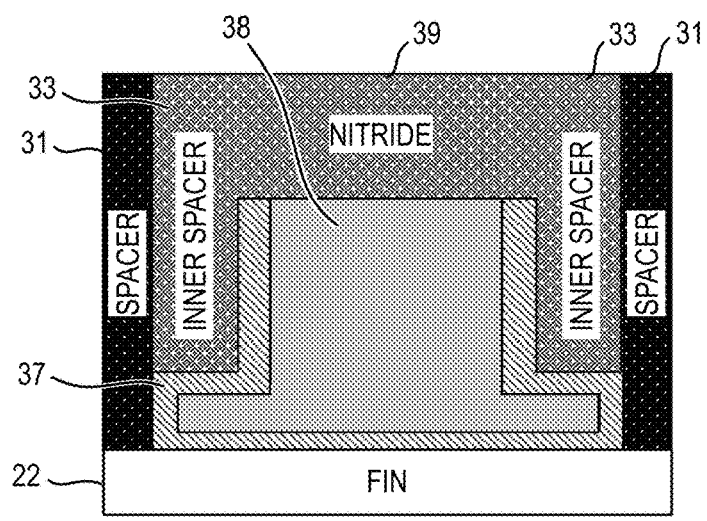
FIG. 11 is a schematic, cross-sectional view taken along line 11-11 of FIG. 14, showing the structure of FIG. 10 following formation of a cap on the gate metal.

The gate metal, barrier layer and gate dielectric layer are partially recessed during step 130 using a reactive ion etch. Etch-back processes for removing such materials are known in the art. (In embodiments wherein selective gate metal deposition is timed so that the gate electrodes are confined to the lower portion of the recess 36 and the laterally extending spaces 36A, leaving the upper portion of the recess 36 unfilled, etch-back of the gate metal may be unnecessary.) Overall gate height varies in accordance with the particular device to be fabricated. In some embodiments, the relatively wide portion of the gate metal, which corresponds to the height of the spaces 36A, is ten to twenty nanometers in height. The width of the bottom portion of the gate/barrier layer 38 is greater than the width of the top portion by approximately twice the width of each inner spacer 33. In some embodiments, the width dimension of the bottom portion of the gate/barrier layer 38, as viewed from the perspective of FIG. 11, is at least four nanometers (4 nm) greater than the width of the top portion of this layer.

The portion of the recess 36 above the gate metal is filled with a dielectric material to form a dielectric cap 39 that can protect the gate during self-aligned contact (SAC) etch. The cap may be formed from materials such as silicon nitride to facilitate a self-aligned contact (SAC) process, ensuring requisite selectivity for the SAC etch. After deposition, the dielectric cap material is planarized to remove it from the surface of the structure. The dielectric cap material remains within the recess 36 following planarization, thus completing the structure shown in FIG. 11. Dielectric caps prevent shorting between the metal gates and subsequently formed self-aligned contacts (not shown). As known in the art, self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material of the FinFETs. Self-aligned contacts can accordingly be formed within a metal gate process while preventing gate to contact shorts.

Figure 12:
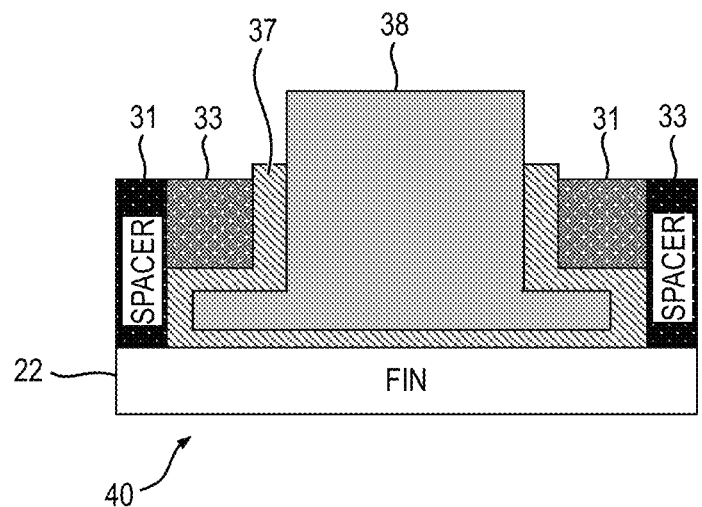
FIG. 12 is a schematic, cross-sectional view taken along line 12-12 of FIG. 14, showing the structure of FIG. 11 following recessing of the spacers and cap to form a gate contact opening.
Figure 13:
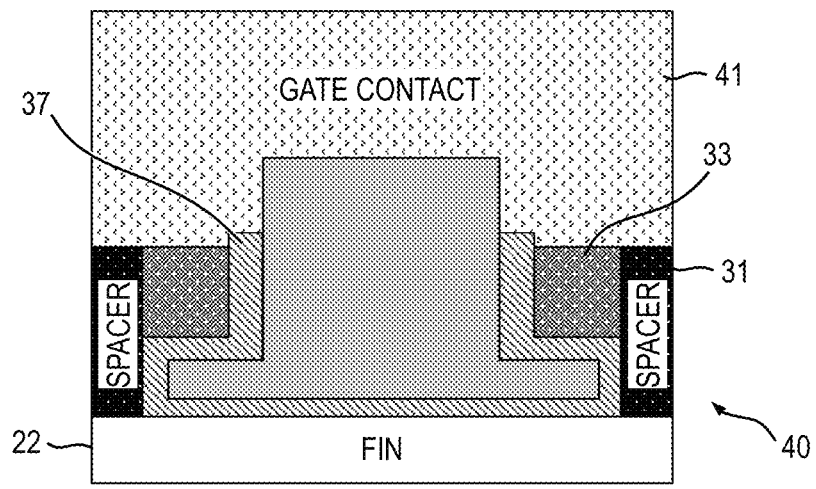
FIG. 13 is a schematic, cross-sectional view taken along line 13-13 of FIG. 14, showing the structure of FIG. 12 following formation of a gate contact.
Figure 14:
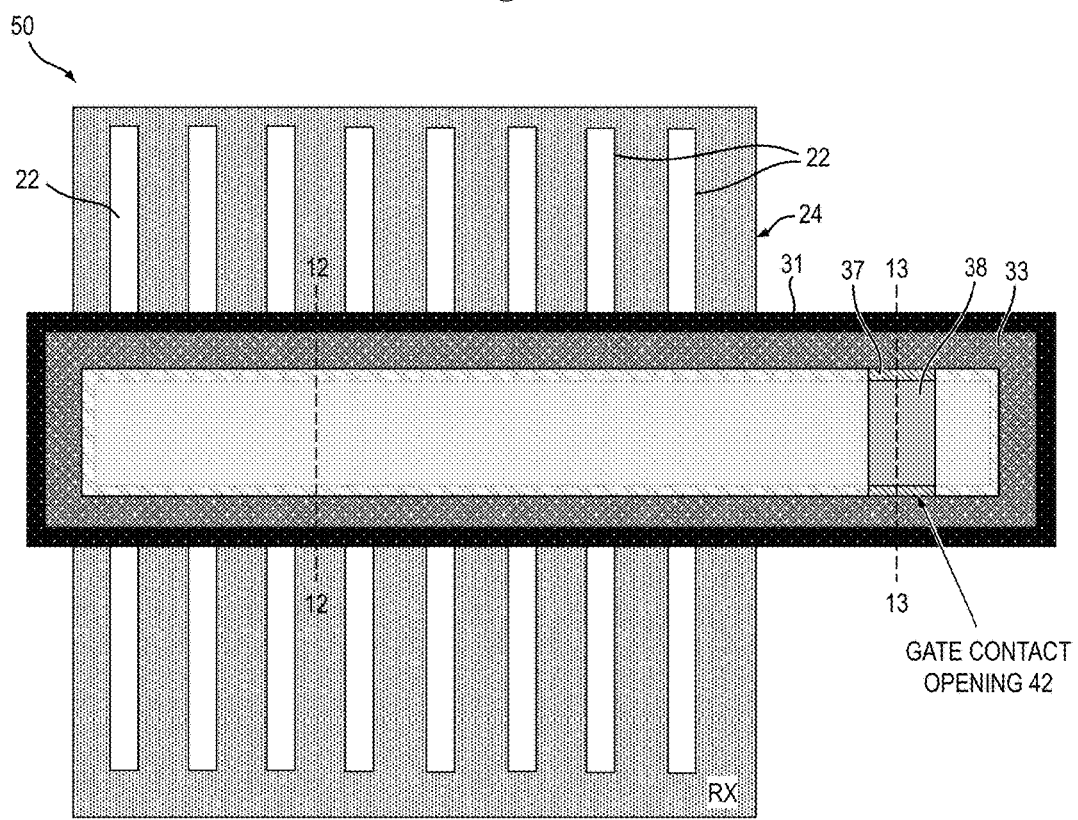
FIG. 14 is a schematic, top plan view showing a gate structure on an active region of a finned substrate.

Referring to FIG. 12, the dielectric materials (the cap 39, the gate dielectric layer 37, and the spacers 31, 33) in the gate contact area 40 are recessed in step 135 to expose the metal gate. Contact metal 41 deposited in the gate contact area 40, as shown in FIG. 13, adjoins the gate metal. FIG. 14 is a top plan view that schematically illustrates an active region (RX) of a monolithic structure 50 including a gate contact opening 42 in which the gate contact metal 41 is deposited.

FIGS. 1-15, as discussed above, depict exemplary processing steps/stages in the fabrication of an exemplary structure 50 including gate structures comprising inner spacers in the less active top portions of the gates of FinFET devices. Decreases in gate to source/drain contact capacitance are accordingly obtained by the additional, preferably low-k dielectric spacer material within the sidewall spacers. The inner spacers are located in regions where the gate metal and the source/drain contacts are in relatively close proximity and therefore would, in the absence of such inner spacers, exhibit relatively high capacitance. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 7:
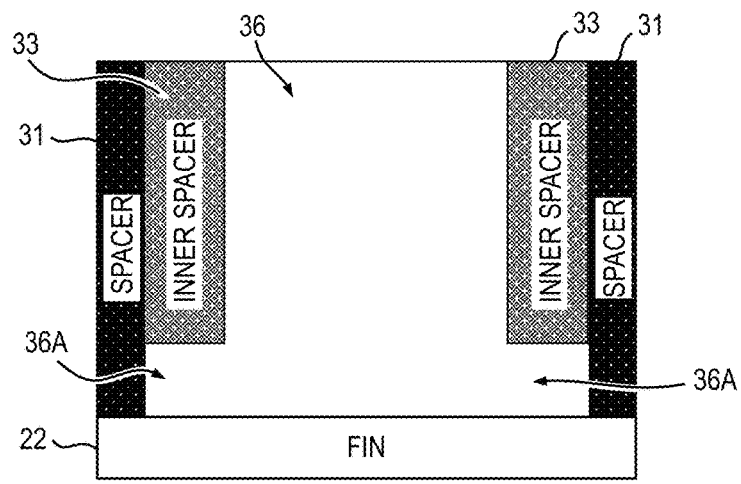
FIG. 7 is a schematic, cross-sectional view showing the structure of FIG. 6 following the removal of the remaining portion of the dummy gate in the gate region.

Given the discussion thus far, it will be appreciated that, in general terms, an exemplary fabrication method includes obtaining a monolithic structure including a plurality of parallel semiconductor fins 22, a dummy gate 30 on the semiconductor fins, and sidewall spacers 31 on the dummy gate. The dummy gate is partially removed to form a recess 36 between the sidewall spacers 31 and above a remaining portion of the dummy gate, such as schematically illustrated in FIG. 5. Inner spacers 33 are formed within the recess 36 and on the sidewall spacers 31 during step 110. The remaining portion of the dummy gate is removed in step 115, thereby exposing a channel portion of the semiconductor fin 22 and forming spaces 36A beneath the inner spacers 33 as schematically illustrated in FIG. 7. A gate dielectric layer 37 is formed within the recess 36 and the spaces 36A and on the channel portion of the semiconductor fin 22. A barrier layer is formed on the gate dielectric layer the recess 36 and spaces 36A are filled with electrically conductive gate material. A structure as schematically illustrated in FIG. 9 is accordingly obtained. The method of claim 1 may further include forming a plurality of FinFET devices using one or more of the plurality of parallel semiconductor fins. In some embodiments, the method further includes forming the inner spacers 33 from a material having a dielectric constant of less than 3.9. In some embodiments, the dielectric constant of the sidewall spacers 31 exceeds 3.9. The method may further include recessing the electrically conductive gate material and forming a dielectric cap 39 on the recessed electrically conductive gate material. In one or more embodiments, filling the recess 36 and spaces 36A with electrically conductive gate material further includes forming a metal gate structure having a top portion between the inner spacers 33 and a bottom portion, the top portion having a smaller width dimension and a greater height dimension than the bottom portion of the metal gate structure. FIG. 11 schematically illustrates such relative height and width dimensions of the metal gate structure that help avoid the generation of unwanted capacitance while allowing satisfactory device performance.

Given the discussion thus far, it will also be appreciated that an exemplary monolithic structure is provided that includes a substrate 24 including a plurality of parallel, monocrystalline semiconductor fins 22, the fins including one or more channel regions and source/drain regions 32 integral with and adjoining the channel regions. A gate structure adjoins each fin channel region. Each gate structure includes a pair of sidewall spacers 31, a pair of inner spacers 33 adjoining the sidewall spacers, and an electrically conductive gate including a top portion between the inner spacers and a bottom portion extending laterally beneath the inner spacers. The top portion of the electrically conductive gate has a smaller width dimension and a greater height dimension than the bottom portion thereof in one or more embodiments. The inner spacers comprise a dielectric material having a dielectric constant less than 3.9 in some embodiments. The inner spacers 33 may consist entirely of low-k material. The electrically conductive gate may include tungsten. The gate structure may further include a nitride cap or other dielectric cap to protect the gate electrode during the formation of self-aligned contacts.

A gate structure for a FinFET device includes a pair of sidewall spacers 31, a pair of inner spacers 33 adjoining the sidewall spacers, and an electrically conductive gate including a top gate portion between the inner spacers and a bottom gate portion extending beneath the inner spacers. The top gate portion of the electrically conductive gate has a smaller width dimension and optionally a greater height dimension than the bottom gate portion thereof. An exemplary gate structure further including a dielectric cap is schematically illustrated in FIG. 11.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FinFET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A structure for a FinFET device, comprising:
a plurality of parallel semiconductor fins disposed on a substrate;
a pair of outer spacers disposed directly on at least one of the plurality of fins;
a pair of inner spacers between and adjoining the outer spacers,
an electrically conductive gate including an upper gate portion between the inner spacers and a lower gate portion extending laterally beneath the inner spacers and between the outer spacers; and
extension junctions formed in the at least one fin, wherein the extension junctions do not extend laterally beneath the outer spacers;
wherein the inner spacers separate the upper gate portion and the outer spacers; and
wherein the lower gate portion separates the inner spacers and the at least one of the plurality of fins.

2. The structure of claim 1, wherein inner surfaces of the inner spacers are substantially vertical, and wherein inner surfaces of the outer spacers are substantially vertical.

3. The structure of claim 1, wherein the upper gate portion has a smaller width dimension than the lower gate portion, and wherein the width dimension of the lower gate portion is greater than that of the upper gate portion by approximately a combined width of the pair of inner spacers.

4. The structure of claim 1, wherein the upper gate portion has a greater height dimension than the lower gate portion.

5. The structure of claim 1, wherein the inner spacers comprise a low-k dielectric material.

6. The structure of claim 5, wherein the inner spacers comprise a dielectric material having a dielectric constant less than 3.9.

7. The structure of claim 6, wherein the inner spacers comprise a dielectric material having a dielectric constant less than 3.0.

8. The structure of claim 6, wherein the outer spacers comprise a dielectric material having a dielectric constant greater than 3.9.

9. The structure of claim 5, further including a high-k gate dielectric layer between the upper and lower gate portions of the electrically conductive gate and the inner and outer spacers.

10. The structure of claim 9, wherein the gate dielectric layer comprises at least one dielectric metal oxide having a dielectric constant greater than 3.9.

11. The structure of claim 9, further including a barrier layer between the upper and lower gate portions of the electrically conductive gate and the high-k gate dielectric layer.

12. The structure of claim 1, further including a barrier layer between the upper and lower gate portions of the electrically conductive gate and the inner and outer spacers.

13. The structure of claim 1, further including a dielectric cap on the electrically conductive gate and extending between the inner spacers.

14. The structure of claim 1, wherein the structure is monolithic, and wherein the fins are monocrystalline.

15. The structure of claim 1, further comprising source/drain regions adjoining the outer spacers and disposed directly on the at least one fin, wherein the outer spacers are between the source/drain regions and separate the source/drain regions from the electrically conductive gate.

16. The structure of claim 15, further comprising an interlayer dielectric disposed on the source/drain regions but not disposed on or between the outer spacers.

17. The structure of claim 1, further comprising an electrically insulating layer between the at least one fin and the substrate, wherein the at least one fin separates the outer spacers from the electrically insulating layer.

18. The structure of claim 17, wherein the electrically insulating layer comprises a buried oxide layer.

19. A structure for a FinFET device, comprising:
a plurality of parallel semiconductor fins disposed on a substrate;
a pair of outer spacers disposed directly on at least one of the plurality of fins;
a pair of inner spacers between and adjoining the outer spacers;
an electrically conductive gate including an upper gate portion between the inner spacers and a lower gate portion extending laterally beneath the inner spacers and between the outer spacers; and
source/drain regions adjoining the outer spacers and disposed directly on the at least one fin, wherein the outer spacers are between the source/drain regions and separate the source/drain regions from the electrically conductive gate;
wherein the inner spacers separate the upper gate portion and the outer spacers;
wherein the lower gate portion separates the inner spacers and the at least one of the plurality of fins; and
wherein the at least one fin comprises a channel region which extends laterally beneath the outer spacers and which does not extend laterally beneath the source/drain regions.

* * * * *